(12) United States Patent
Nielsen et al.

(10) Patent No.: US 7,119,629 B2
(45) Date of Patent: Oct. 10, 2006

(54) SYNCHRONIZED CONTROLLED OSCILLATION MODULATOR

(75) Inventors: Karsten Nielsen, Helsingor (DK); Jesper Lind Hansen, Copenhagen (DK)

(73) Assignee: Bang & Olufsen Icepower A/S, Lyngby (DK)

(*) Notice: Subject to any disclaimer, the term of this patent is extended or adjusted under 35 U.S.C. 154(b) by 34 days.

(21) Appl. No.: 10/498,314

(22) PCT Filed: Dec. 16, 2002

(86) PCT No.: PCT/IB02/05412

§ 371 (c)(1),
(2), (4) Date: Jun. 10, 2004

(87) PCT Pub. No.: WO03/055060

PCT Pub. Date: Jul. 3, 2003

(65) Prior Publication Data

US 2005/0068121 A1    Mar. 31, 2005

(30) Foreign Application Priority Data

Dec. 21, 2001  (SE) .................................. 0104401

(51) Int. Cl.
*H03K 7/00* (2006.01)
(52) U.S. Cl. ............... 332/106; 332/169; 332/149; 330/10
(58) Field of Classification Search ............ 331/2, 331/46, 50; 332/109, 127, 149, 162, 106; 330/10
See application file for complete search history.

(56) References Cited

U.S. PATENT DOCUMENTS

| 4,531,096 | A | * | 7/1985 | Yokoyama ................ 330/10 |
| 4,724,396 | A | | 2/1988 | Taylor et al. |
| 5,901,054 | A | | 5/1999 | Leu et al. |
| 5,973,569 | A | * | 10/1999 | Nguyen ................... 330/298 |
| 6,137,373 | A | | 10/2000 | Mori |
| 6,297,692 | B1 | * | 10/2001 | Nielsen ..................... 330/10 |
| 6,297,693 | B1 | * | 10/2001 | Pullen ...................... 330/10 |
| 6,538,516 | B1 | * | 3/2003 | Lenk .......................... 331/2 |

FOREIGN PATENT DOCUMENTS

EP   0 871 328 A1   10/1998
WO   WO 98/19391   5/1998

OTHER PUBLICATIONS

International Search Report (PCT/ISA/210).
Attwood, Brian E., "Design Parameters Important for the Optimization of Very-High-Fidelity PWM (Class D) Audio Amplifiers," J. Audio Eng. Soc., vol. 31, No. 11, Nov. 1983, pp. 842-853.

* cited by examiner

*Primary Examiner*—Joseph Chang
(74) *Attorney, Agent, or Firm*—Harness, Dickey & Pierce, P.L.C.

(57) ABSTRACT

A synchronized controlled oscillation modulator (SCOM), comprising at least one, Controlled Oscillation Modulator (5), and synchronizing means (1, 6) connected to said COM modulator. The modulator can comprise several COM modulators, and the synchronizing means can be arranged between the COM systems, so that the oscillation modulator signal is used as synchronization signal. The invention provides significant advantages in performance, topological simplification, improved robustness, stability and efficiency compared to prior art.

14 Claims, 6 Drawing Sheets

SYNCHRONIZED CONTROLLED OSCILLATION MODULATOR

TECHNICAL FIELD

This invention relates to a self-oscillating modulator, comprising a comparator and a power amplification stage for pulse width modulation, and higher order oscillating loops comprising first feedback means and first forward means securing stable oscillating conditions.

The invention also relates to a switching power conversion system, such as DC-AC (e.g. audio amplification), DC-DC or AC-AC conversion systems or any combination of the above mentioned comprising such a modulator. The invention may advantageously be used for improved power conversion in any system, in particular precision DC-AC conversion systems such as high efficiency audio amplification.

TECHNICAL BACKGROUND

The pulse width modulator is a central element of any power conversion system. Most switching power converters are based on Pulse Width Modulation (PWM) as means to control efficient conversion between domains (DC or AC).

A typical power converter may include a PWM modulator, a switching power conversion stage, a filter and a control system. A prior art system of this type is described in U.S. Pat. No. 4,724,396 and by Mr. Attwood in Journal of the AES, November 1983. p. 842–853. However, PWM has a range of shortcomings also well known to the art, mainly due to the implementation of the carrier generation. This limits the system bandwidth and complicates design. Also, a stable and robust control system design is difficult.

In order to overcome these drawbacks, a controlled oscillating modulator (COM) was introduced in the applicant's international patent application PCT/DK97/00497. The disclosed modulator eliminates the need of a carrier generator, with a range of advantages, described in detail in said document.

A problem with this technique is that it can only synthesize standard two level modulation—hence giving disadvantages concerning the efficiency of the amplifier.

Another problem arises in multi channel systems such as multi channel audio amplifiers, the oscillating modulators will have oscillation frequency variations, which will cause intermodulation products, adding distortion components within the audio bandwidth. A prior art system for synchronizing an oscillating modulator to an external clock is given in U.S. Pat. No. 6,297,693. This prior art system can only comprise a sawtooth or a triangular signal shape as synchronization signal eliminating possibilities to use COM modulator signals as synchronization signals. Furthermore the system can only synchronize a modulator to an external clock leading to higher complexity when implementing an external clock generator.

In multilevel systems such as, but not limited to PSCPWM systems (as described in applicants international patent application PCT/DK98/00133), the first harmonic of the carrier is not present at the output, and said COM modulator can thereby not be used.

OBJECTS OF THE INVENTION

Accordingly, an object of the invention is to provide a superior modulation technique in switching power conversion systems that overcomes fundamental problems related to conventional techniques.

SUMMARY OF THE INVENTION

These objects are achieved by a novel synchronized controlled oscillating modulator (SCOM) of the type mentioned above, having synchronizing means connected to said COM modulator.

The invention provides significant advantages in performance, topological simplification, improved robustness, stability and efficiency compared to prior art.

The invention provides synchronization between a signal source and a single COM modulator or a plurality of COM modulators and a signal source or between a plurality of COM modulators in order to overcome prior art problems related to COM modulators being desynchronized.

The COM modulators can comprise voltage or current measurement means, and feedback.

The synchronization means can use an external source as synchronization signal, where the external source can preferably but not necessarily be a triangular-, square- or sinusoidal signal.

Alternatively, the modulator comprises several COM modulators, and the synchronizing means are arranged between the COM systems, so that the oscillation modulator signal is used as synchronization signal. In this case, the SCOM aims to combine the advantages of the COM technology with the advantages of multi-level PWM.

According to this embodiment, pulse modulation in general power conversion systems is provided that implements multiple level pulse modulated signals—hence reducing the output switching noise energy and enhancing the possibilities for control system implementation.

The SCOM modulator according to the invention is very suitable in all types of precision DC-AC conversion applications as audio amplification and motor or electrodynamic transducer drive applications.

The SCOM can advantageously be used in precision voltage or current controlled DC-AC conversion as e.g. power amplifiers for audio use.

The power amplification stage can comprise an output filter, and the second feedback means can then be connected to an output from said output filter. This permits a first filtering of the voltage before it is fed back in the feedback path.

BRIEF DESCRIPTION OF THE DRAWINGS

Preferred embodiments of the present invention will be further described in the following, with reference to the appended drawings.

DETAILED DESCRIPTION OF THE PREFERRED EMBODIMENTS

Figure 1:
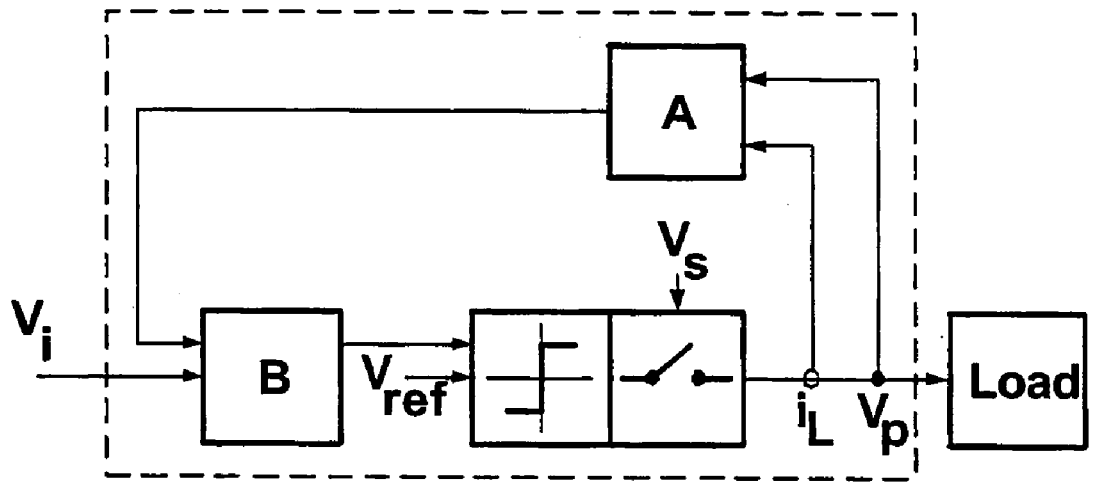
FIG. 1 illustrates a prior art controlled oscillating modulator based on voltage feedback.
Figure 2:
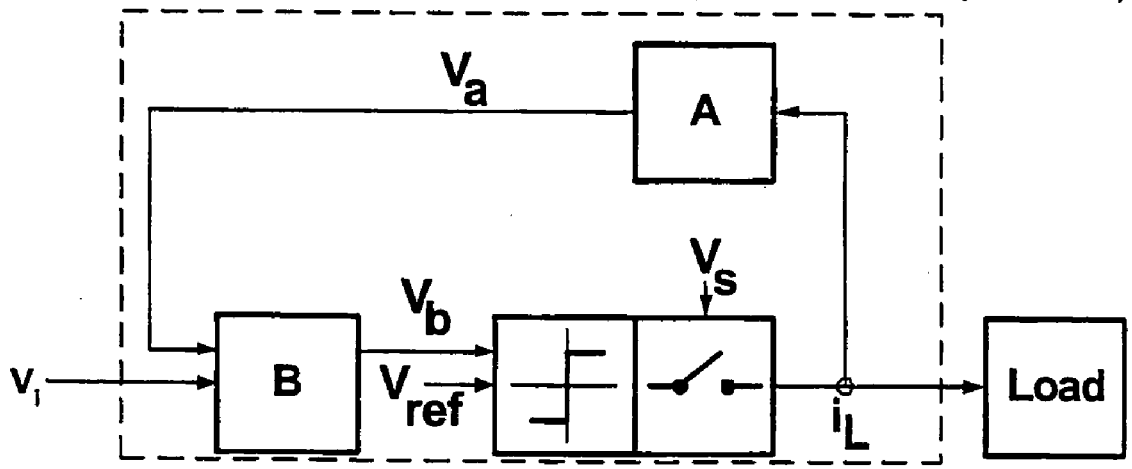
FIG. 2 illustrates a prior art controlled oscillating modulation system comprising current feedback.

In the following detailed description of the preferred embodiments, the COM modulators can be Voltage Controlled Oscillating Modulators (FIG. 1) as described in U.S. Pat. No. 6,297,692 or Current controlled Oscillating Modulators (FIG. 2) as described in the International Publication Number WO 02/025357, both hereby incorporated by reference.

Figure 3:
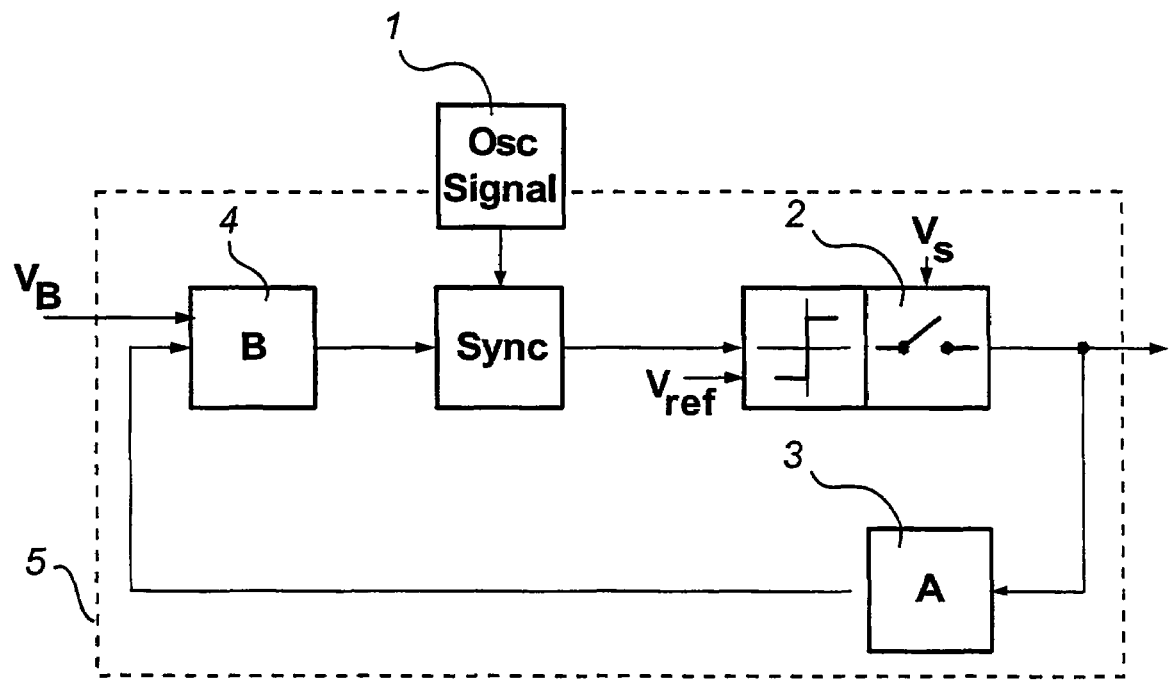
FIG. 3 illustrates a block diagram of a modulator according to a first embodiment of the invention.

A power conversion system comprising a modulator according to a first preferred embodiment of the invention is shown in FIG. 3. The system comprises a power stage 2, a control system with a feedback block 3 and a forward block 4. The power stage 2 can comprise one or a plurality of half-bridges, preferably a full-bridge comprising two half-bridges. The feedback block and the forward block constitute an oscillating modulator 5. An external signal source 1, also referred to as an oscillating signal generator block, is connected to a synchronization block 6 in the modulator 5.

The synchronization of the modulator 5 is obtained by adding the Osc Signal from the source 1 to the modulating signal. The synchronization signal can be based on a voltage signal or a current signal depending on the type of modulator (voltage based feedback or current based feedback). The Osc Signal can be a sinusoidal signal or any other oscillating signal with the frequency of the wanted idle switching frequency and is used for synchronizing said modulator with said Osc signal of the Osc Signal generating block 1.

Figure 4:
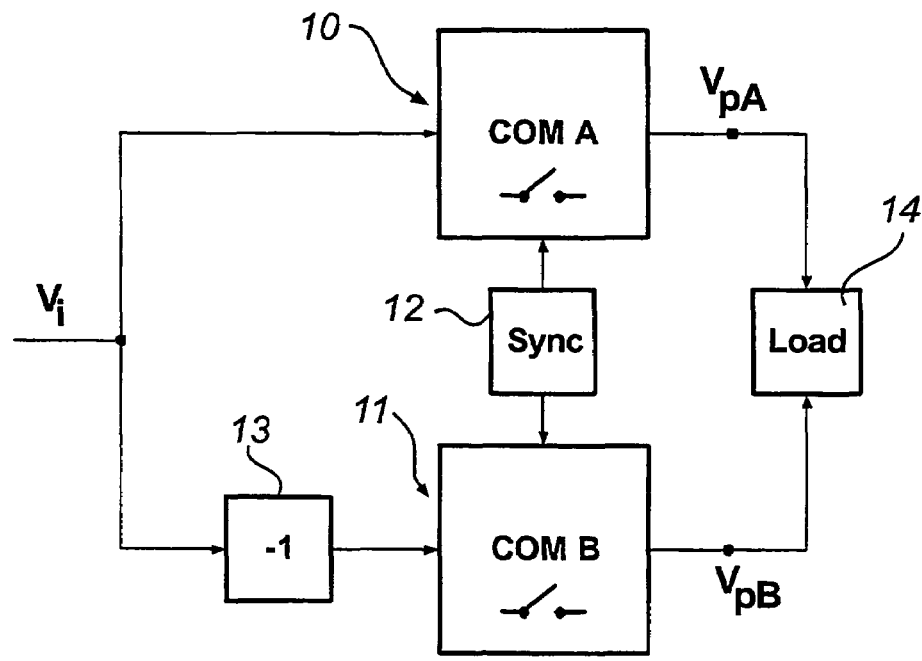
FIG. 4 illustrates a block diagram of a 3-level modulator according to a second embodiment of the invention.

A second preferred embodiment of the invention is shown in FIG. 4, where two COM modulators 10, 11 are synchronized by one synchronizing signal from a synchronization block 12. Again, the synchronization signal can be based on a voltage signal or a current signal depending on the type of modulator (voltage based feedback or current based feedback).

The two COM modulators are designed to oscillate at almost the same frequency, but a variation in the switching frequency can be eliminated by the synchronization means.

By the use of two COM modulators 10, 11 it is possible to make a 3-level modulator. Each side of a load 13 is supplied with its own 2-level COM modulator 10, 11, which each are synchronized.

The first harmonic of the carrier will ideally be eliminated across the load. The input signal is inverted by an inverter 14 preceding the second COM 11, in order to be able to make a differential audio signal on the output. The spectral characteristics resemble those of the NBDD modulation. The NBDD can be seen from "Audio power amplifier techniques with energy efficient power conversion", Ph.D Thesis by Karsten Nielsen.

The use of said 3-level modulation can advantageously be used for driving a pulse modulated transducer directly without any output filtering of the PWM signal thus reducing eddy current losses in the transducer 6 compared to a 2-level modulation.

Figure 5:
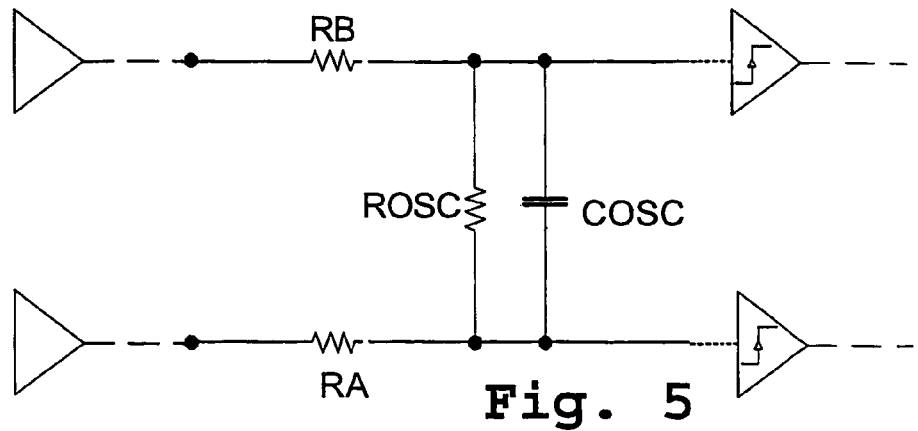
FIG. 5 illustrates a hardware implementation of the synchronization means in FIGS. 3 and 4.

FIG. 5 shows an example of a realization of the synchronizing means in FIGS. 3 and 4. The synchronization means are implemented as a circuit of two series resistances RA, RB connected to each end of a parallel circuit consisting of a resistor ROSC and a capacitor COSC.

By the use of this network a small amplitude signal is added to the COM modulator forcing the COM modulator to oscillate at the added small amplitude signal frequency. Thereby one or a plurality of COM modulators can be synchronized by adding a small amplitude signal with the frequency of the wanted idle frequency to each of the modulators.

The values of the resistances and capacitors can be determined by the skilled person in a trade-off between having good synchronization and not having to influence either of the modulators negatively.

Figure 6:
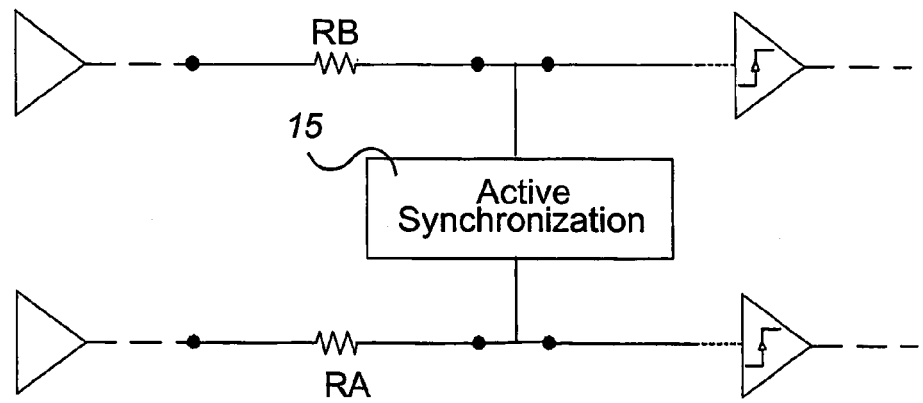
FIG. 6 illustrates a further embodiment of the invention for active synchronization of COM modulators.

A further preferred embodiment of the invention is shown in FIG. 6 and illustrates an active synchronization system for obtaining synchronization of COM modulators. The active synchronization block 15 comprises one or a plurality active high pass filters.

Figure 7:
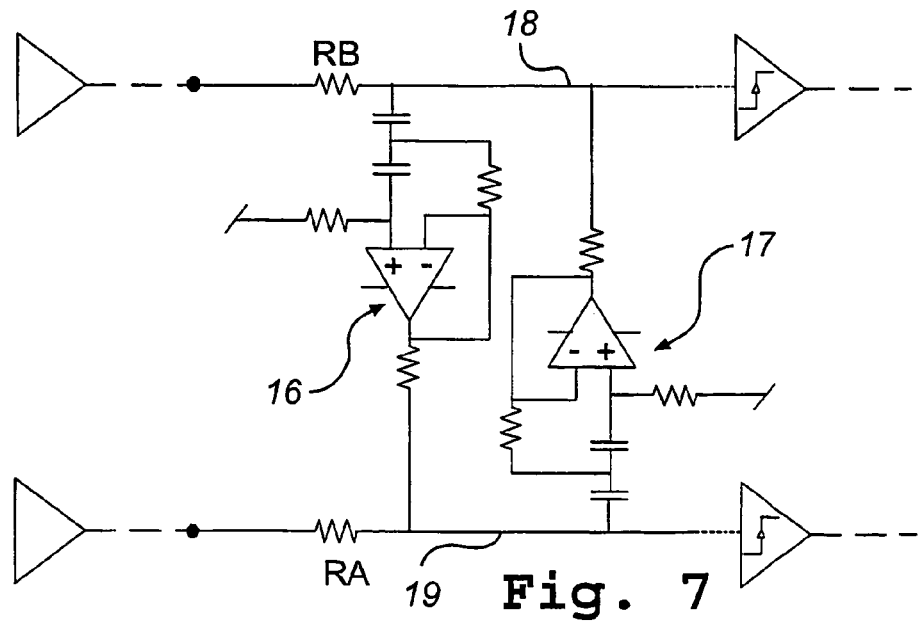
FIG. 7 illustrates an implementation of the active synchronization in FIG. 6.

FIG. 7 gives an example of the active synchronization block 15 in FIG. 6, implemented as two active high pass filters 16, 17. One high pass filter 16 sums a first high pass filtered COM modulator signal at node 18 to a second COM modulator signal at node 19 and thereby synchronizes the second COM modulator with the first. The optimal synchronization will be obtained if also a second high pass filter 17 sums a high pass filtered second modulator signal at node 19 to the first modulator signal at node 18.

Figure 8:
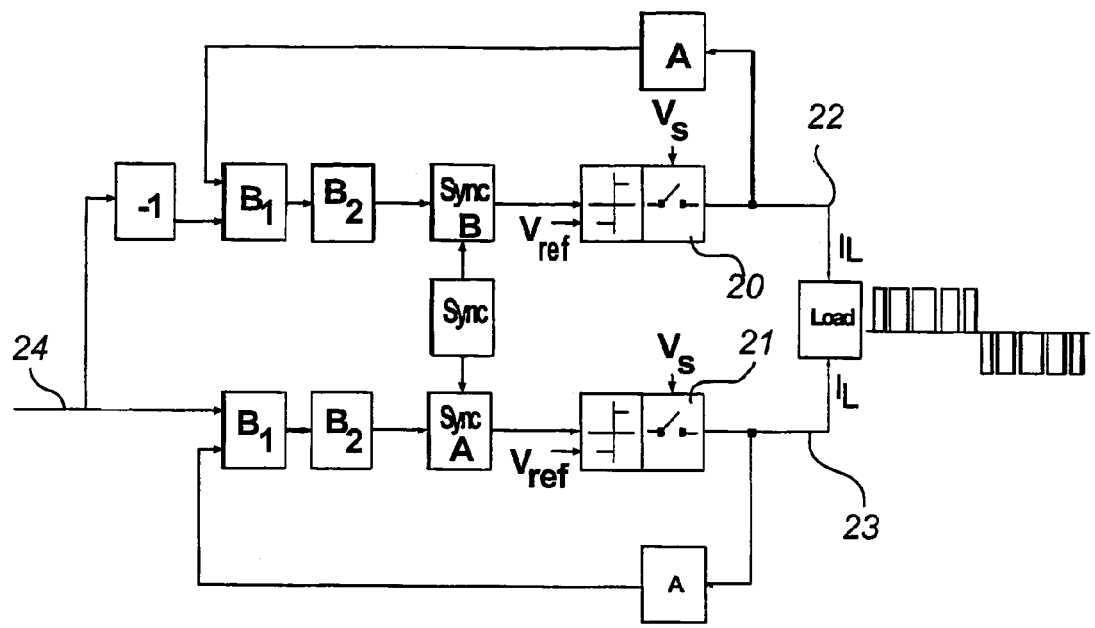
FIG. 8 illustrates a power conversion system with two COM modulators, synchronized according to the invention.

A power conversion system with two COM modulators, synchronized according to the invention, is shown in FIG. 8. Two lag-blocks B1, B2 are inserted in the forward path contributing to a higher loop gain at low frequencies. There is not any high power filtering applied to the system but the load, preferably an electro-dynamic transducer, will act as an inductive load obtaining some filtering of the PWM signal. Thereby the output filter can be eliminated and efficiency increased. Each power stage 20, 21 can comprise one or a plurality of half-bridges, and preferably comprise a single half-bridge.

Figure 9:
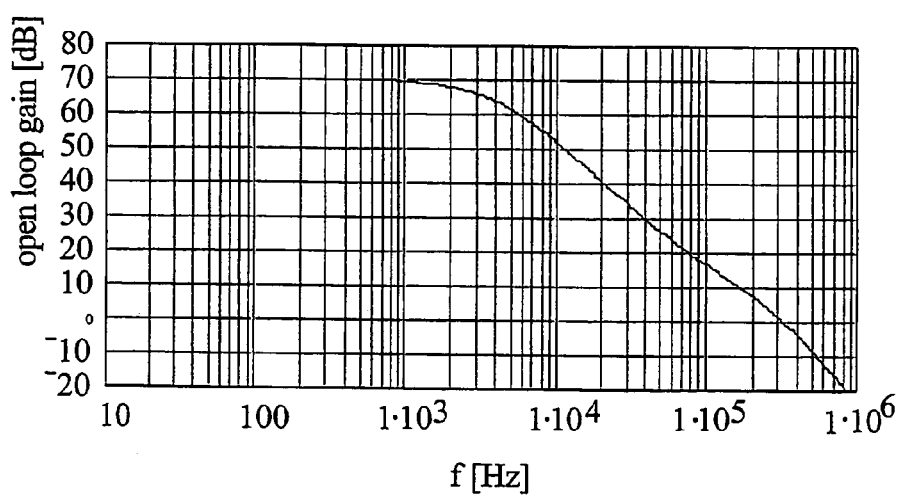
FIG. 9 illustrates the open loop gain of the system in FIG. 8.

The open loop gain for the system in FIG. 8 is shown in FIG. 9. The system is designed for a switching frequency of approximately 325 kHz. At 325 kHz the open loop gain is 0 dB and at that frequency the phase is −180 degrees, obtaining a controlled oscillation. The system shown in FIG. 8 will be capable of suppressing noise and distortion within the 325 kHz bandwidth.

The system output is a differential 3-level PWM signal with high frequency spectral characteristics resembling those of the NBDD modulation obtaining a more efficient modulation compared to modulation topologies with a differential two level PWM output signal.

If the modulators in the system shown in FIG. 9 are completely synchronized, there will be a differential output of zero magnitude at idle. This is caused by the signal at idle on one terminal 22 of the load is equal to the signal on the other terminal 23 of the load obtaining a differential signal of zero magnitude.

The synchronization can be obtained by synchronization means as shown in FIG. 5, as a synchronization network comprising an R, C or RC circuit. The R, C or RC circuit being connected to the comparator in the forward path. The synchronization can also be obtained as in FIGS. 6 and 7, as an active network comprising high pass active filter networks.

Furthermore the modulation depth can be controlled by limiting the amplitude of the input signal at the input signal node 24, achieving lower ripple currents.

Figure 10:
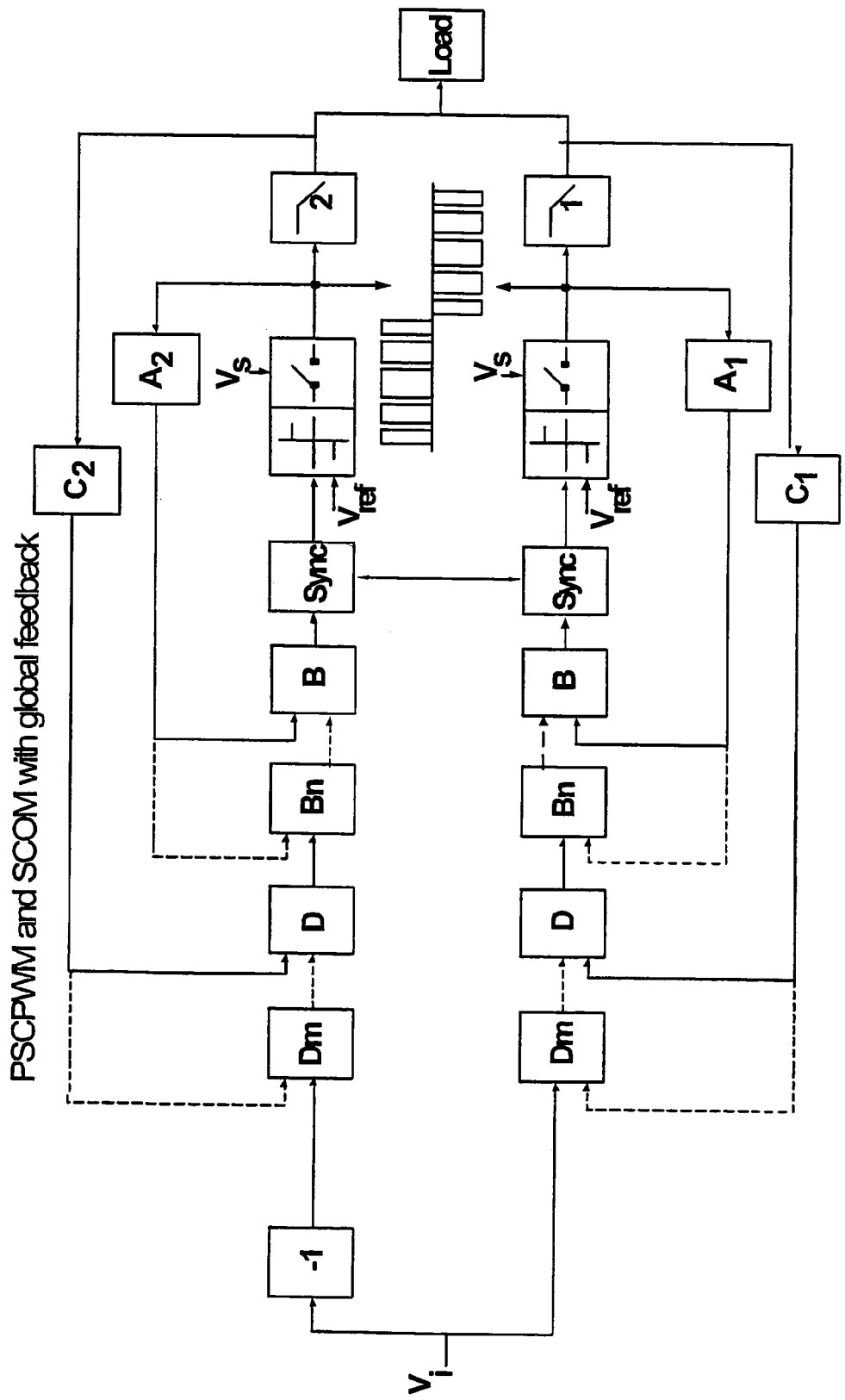
FIG. 10 illustrates an implementation of a synchronization according to the invention in a PSCPWM modulator structure.

FIG. 10 shows an SCOM according to the invention implemented in multilevel PWM comprising a PSCPWM modulator structure and a MECC (N,M) control system where N,M are integers. MECC (N,M) is described in U.S. Pat. No. 6,297,692, hereby incorporated by reference. The system comprises one or a plurality of feedback paths and low pass filtering of the output PWM signal 25, 26. With the SCOM system comprising a PSCPWM modulator it is possible to obtain a multi-level (more than two levels) modulator, preferably without high frequency common mode components on the output. Each power stage 27, 28 comprises one or a plurality of half-bridges. If each power stage 27, 28 comprises two half-bridges in a full-bridge structure it is possible to obtain a multi-level (more than two levels) modulator, without high frequency common mode components on the output.

Figure 11:
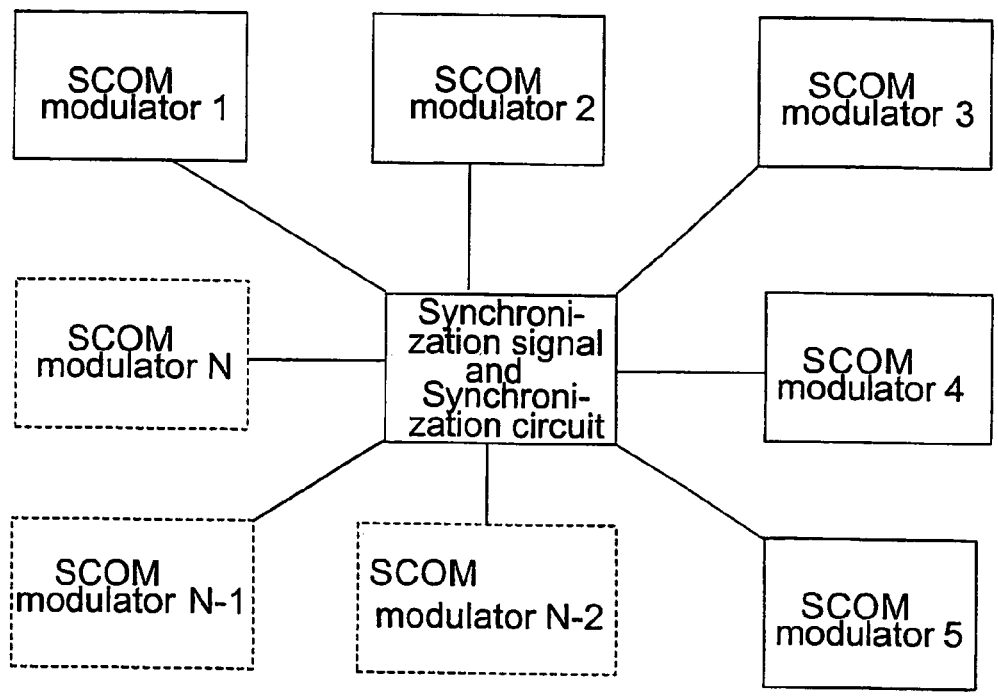
FIG. 11 illustrates a plurality of N (where N is an integer) COM modulators synchronized by an additional synchronization signal.

In FIG. 11, N (where N is an integer) SCOM modulators are synchronized by an additional synchronization signal. This synchronization signal can be any signal shape but preferably triangular, square or sinusoidal with a frequency of the wanted idle switching frequency. The synchronization means can be any one of those described above.

Figure 12:
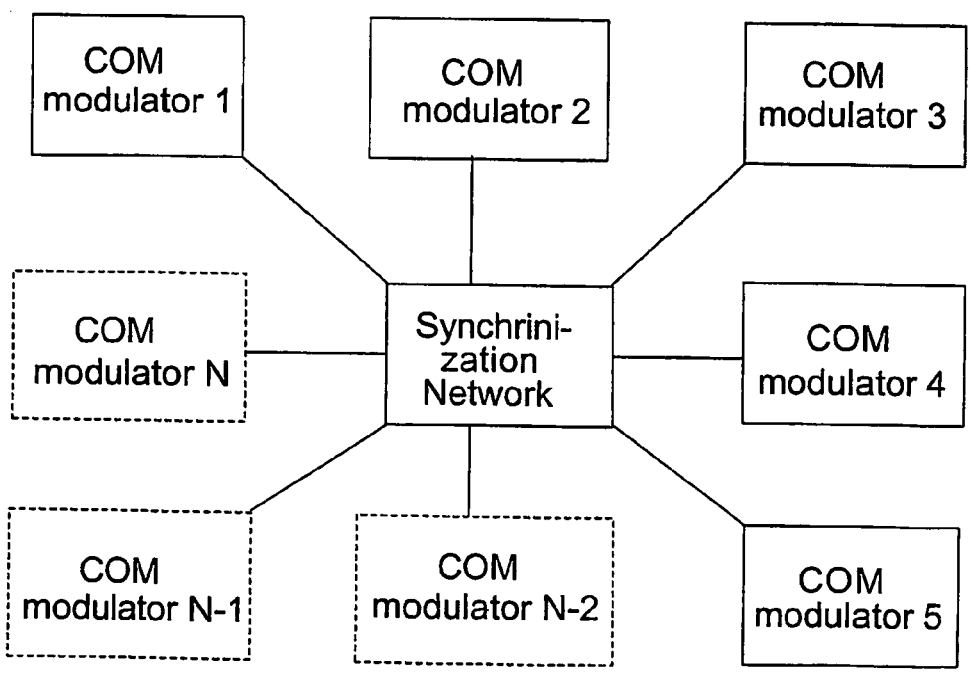
FIG. 12 illustrates a plurality of N (where N is an integer) COM modulators synchronized by their common COM signals.

In FIG. 12, N (where N is an integer) COM modulators are synchronized by their common COM signals. The common COM synchronization signal can be any signal shape with the frequency of the wanted idle switching frequency. The synchronization means can be any one of those described above.

The SCOM modulator can be implemented in any given AC-AC, DC-DC, AC-DC or DC-AC power conversion system, in particular a high precision DC-AC audio power conversion system where the power stage elements operates in either "on" or "off" state.

The invention claimed is:

1. A synchronized controlled oscillation modulator (SCOM), comprising:
   at least one controlled oscillation modulator (COM) having a non-hysteresis comparator, a switching stage and a negative feedback loop adapted to achieve conditions for controlled oscillation of a predetermined frequency by means of at least two poles, and
   a synchronizing device connected to said COM modulator.

2. A modulator according to claim 1, wherein the synchronizing device comprises an oscillation signal generator.

3. A modulator according to claim 1, wherein the modulator is synchronized by another SCOM modulator comprising any oscillating modulator signal with the frequency of a wanted idle switching frequency.

4. A modulator according to claim 1, comprising a second COM modulator, said synchronizing device being connected between forward paths of said COM modulators and arranged to synchronize the COM modulators with each other.

5. A modulator according to claim 3, wherein said synchronization device comprises a circuit consisting of R, RC or C components.

6. A modulator according to claim 5, wherein said synchronizing device comprises:
   a first and a second series resistances (RA, RB), a parallel resistor (Rosc), and a parallel capacitor (Cosc), wherein said first series resistance is connected to a first end of the parallel capacitor and parallel resistor, and said second series resistance is connected to a second end of the parallel capacitor and parallel resistor, and wherein said first and second series resistances are connected to a comparator in the forward path of each modulator respectively.

7. A modulator according to claim 3, wherein said-synchronization-device comprises an active circuit, preferably including at least one high pass filter.

8. A modulator according to claim 1, wherein the modulator is extended by an additional SCOM modulator driven in a full-bridge configuration to achieve a three-level pulse output.

9. A modulator according to claim 8, wherein the modulator is implemented in a PSCPWM system, without common mode high frequency spectral contributions in the three level pulse output.

10. A modulator according to claim 1, wherein the modulator is implemented in a multi-loop MECC (N,M) control system for enhanced noise suppression, where N and M are integers representing the number of local and global control loops respectively.

11. A modulator according to claim 1, further comprising N COM modulators synchronized by an additional synchronization signal or by a common COM signal of said COM modulators.

12. A modulator according to claim 1, further comprising a limiter device to control the PWM modulation depth.

13. A modulator according to claim 1, wherein the modulator is implemented in a general power conversion system, in the general power conversion system is in a DC-AC audio power conversion system.

14. A modulator according to claim 1, wherein the modulator is used to drive an electrodynamic transducer load directly.

* * * * *